(12) United States Patent
Daub et al.

(10) Patent No.: US 8,460,465 B2
(45) Date of Patent: Jun. 11, 2013

(54) SUPPORT RING FOR SUPPORTING A SEMICONDUCTOR WAFER COMPOSED OF MONOCRYSTALLINE SILICON DURING A THERMAL TREATMENT, METHOD FOR THE THERMAL TREATMENT OF SUCH A SEMICONDUCTOR WAFER, AND THERMALLY TREATED SEMICONDUCTOR WAFER COMPOSED OF MONOCRYSTALLINE SILICON

(75) Inventors: Erich Daub, Emmerting (DE); Raimund Kaiss, Neuoetting (DE); Michael Kloesler, Burghausen (DE); Thomas Loch, Burghausen (DE)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 13/274,456

(22) Filed: Oct. 17, 2011

(65) Prior Publication Data

US 2012/0098100 A1    Apr. 26, 2012

(30) Foreign Application Priority Data

Oct. 20, 2010   (DE) .......................... 10 2010 042 686
Sep. 20, 2011   (DE) .......................... 10 2011 083 041

(51) Int. Cl.
*C30B 35/00*   (2006.01)
*H01L 21/00*   (2006.01)

(52) U.S. Cl.
USPC .......................... 117/200; 438/799; 117/204

(58) Field of Classification Search
CPC .............. H01L 29/168; H01L 29/66068; H01L 29/1602; H01L 21/324; H01L 21/2686; C30B 15/14; C30B 11/003; C30B 15/00
USPC .................. 257/77, 607, E29.109; 438/799, 438/795, 715, 660, 540; 117/3, 200, 201, 117/204

See application file for complete search history.

(56) References Cited

U.S. PATENT DOCUMENTS

| | | | |
|---|---|---|---|
| 2004/0021097 A1 | 2/2004 | Preece | |
| 2006/0213424 A1 | 9/2006 | Mueller et al. | |
| 2008/0267598 A1* | 10/2008 | Nakamura et al. | 392/416 |
| 2009/0061140 A1 | 3/2009 | Sadohara et al. | |
| 2010/0104806 A1 | 4/2010 | Schwandner | |

FOREIGN PATENT DOCUMENTS

| | | |
|---|---|---|
| DE | 10 2005 013 831 B4 | 9/2006 |
| DE | 11 2006 000 816 T5 | 2/2008 |
| DE | 10 2006 053 942 A1 | 5/2008 |
| DE | 10 2008 053 610 A1 | 7/2010 |
| EP | 1 772 901 A2 | 4/2007 |
| JP | 09251961 A | 9/1997 |
| JP | 2003059851 A | 2/2003 |
| JP | 2006005271 A | 1/2006 |

* cited by examiner

*Primary Examiner* — Nikolay Yushin
(74) *Attorney, Agent, or Firm* — Brooks Kushman P.C.

(57) ABSTRACT

A support ring for supporting a monocrystalline silicon semiconductor wafer during a thermal treatment of the semiconductor wafer has outer and inner lateral surfaces and a curved surface extending from the outer lateral surface to the inner lateral surface, this curved surface serving for the placement of the semiconductor wafer. The curved surface has a radius of curvature of not less than 6000 mm and not more than 9000 mm for 300 mm diameter wafers, or a radius of curvature of not less than 9000 mm and not more than 14,000 mm for 450 mm diameter wafers. Use of the support ring during thermal treatment reduces slip and improves wafer nanotopography.

7 Claims, 5 Drawing Sheets

SUPPORT RING FOR SUPPORTING A SEMICONDUCTOR WAFER COMPOSED OF MONOCRYSTALLINE SILICON DURING A THERMAL TREATMENT, METHOD FOR THE THERMAL TREATMENT OF SUCH A SEMICONDUCTOR WAFER, AND THERMALLY TREATED SEMICONDUCTOR WAFER COMPOSED OF MONOCRYSTALLINE SILICON

CROSS-REFERENCE TO RELATED APPLICATION

This application claims priority to German Patent Application Nos. DE 10 2010 042 686.5 filed Oct. 20, 2010 and DE 10 2011 083 041.3 filed Sep. 20, 2011, which are herein incorporated by reference.

BACKGROUND OF THE INVENTION

1. Field of the Invention

The invention pertains to the field of the thermal treatment of monocrystalline silicon semiconductor wafers.

2. Description of the Related Art

Thermal treatment of silicon wafers is generally carried out in a vertical furnace ("wafer boat"). In such a furnace, a multiplicity of semiconductor wafers are simultaneously heated to high temperatures over a relatively long time period. In this case, they are placed on support rings in a manner stacked one above another and spaced apart from one another. Such a support ring ("susceptor ring") generally consists of silicon carbide and has the task of supporting the semiconductor wafer lying thereon during thermal treatment.

The aim of thermal treatment is to provide a zone ("denuded zone") for electronically active structures which extends from the surface into the interior of the semiconductor wafer and is free of defects which could disturb the function of electronic components. Such defects are, in particular, accumulations of precipitated oxygen, BMD ("bulk micro defects") and defects which are formed by accumulations of vacancies and are referred to, inter alia, as COP defects ("crystal originated particles"). As a result of the thermal treatment, BMD-forming nuclei and COP defects are resolved and the oxygen concentration in the zone is decreased below the threshold necessary for BMD formation.

The larger the size of COP defects, the longer the time needed to be able to resolve them by means of a thermal treatment of the semiconductor wafer. Therefore, it is beneficial, as early as during the pulling of the single crystal yielding the semiconductor wafers from a crucible, to implement measures which generate COP defects having comparatively small dimensions. For this purpose, two measures are usually taken into consideration, which can also be combined. First, rapid cooling of the single crystal prevents vacancies from remaining mobile long enough to be able to agglomerate into comparatively large COP defects. Second, doping the single crystal with nitrogen has the effect that during cooling of the single crystal, vacancy supersaturation is delayed, and correspondingly less time is available for the formation of vacancy accumulations.

At the temperatures in the range of 1050° C. to 1300° C. which prevail during thermal treatment, the crystal lattice of monocrystalline silicon is particularly sensitive to disturbances. Temperature gradients, relative movements of semiconductor wafer and support ring owing to different coefficients of thermal expansion of silicon and silicon carbide and the intrinsic weight of the semiconductor wafer pressing onto the support ring can initiate slip in the crystal lattice or cause scratches.

Measurements of laser scattered light or measurements of the depolarization of laser light are usually used for the detection of stresses and slip. The measurement method based on the latter option is known by the acronym SIRD, which stands for "Scanning Infrared Depolarization". US 2004/0021097 A1 describes a measurement method employing SIRD which can be used to detect defects on semiconductor wafers which are caused by the support ring.

DE 10 2005 013 831 A1 discloses that both the temperature during the thermal treatment and the concentration of nitrogen in the semiconductor wafer have a particular influence on the upper yield stress (UYS). The UYS is a characteristic variable for the resistance of the semiconductor material to the formation of slip. The resistance decreases significantly in the temperature range of 1000° C. to 1350° C., and also with a reduction of the nitrogen concentration. In order to obtain thermally treated semiconductor wafers composed of monocrystalline silicon which exhibit no slip during an SIRD measurement, the cited document recommends using the upper yield stress measured at a temperature of 1200° C. as a criterion for carrying out the thermal treatment in a specific manner. Accordingly, comparatively high heating rates in the temperature range of above 900° C. and/or comparatively high cooling rates in the temperature range down to 900° C. and the use of a closed ring as support ring during the thermal treatment are suitable for only rather relatively resistive semiconductor wafers.

JP 2003059851 A describes a support ring having an inner and an outer lateral surface, a horizontal surface for the placement of the semiconductor wafer, and a rounded or beveled edge between the inner lateral surface and the horizontal placement surface. The distance Ry between the highest peak and the deepest valley within a measurement section detecting the roughness of the edge is not greater than 5 μm.

EP 1 772 901 A2 discloses a two-part support ring, the surface roughness of which expressed in the form of the averaged roughness depth Rz is intended to be not more than 15 μm. A semiconductor wafer composed of silicon, which was heated on such a support ring at a temperature of 1200° C. over a time period of 600 min, exhibited, after the thermal treatment, no slip detectable by means of laser scattered light or depolarization of laser light.

The inventors of the present invention have found, however, that semiconductor wafers composed of monocrystalline silicon, with the use of known support rings during a thermal treatment, are exposed to stresses which can adversely affect the nanotopography of the front side of the semiconductor wafer.

SUMMARY OF THE INVENTION

Therefore, it is an object of the present invention to present an improved support ring, to provide an improved method for the thermal treatment of a semiconductor wafer composed of monocrystalline silicon, and to provide an improved thermally treated semiconductor wafer composed of monocrystalline silicon. These and other objects are achieved in accordance with a first aspect of the invention by means of a monocrystalline silicon support ring which supports a monocrystalline silicon semiconductor wafer during thermal treatment of the semiconductor wafer, comprising an outer and an inner lateral surface and a curved surface extending from the outer to the inner lateral surface and serving for the placement of the semiconductor wafer, the curved surface having a radius of not less than 6000 mm and not more than 9000 mm, if the surface is designed for the placement of a semiconductor wafer having a diameter of 300 mm, or with a radius of curvature of not less than 9000 mm and not more than 14,000 mm, if the surface is designed for the placement of a semiconductor wafer having a diameter of 450 mm.

DETAILED DESCRIPTION OF THE PREFERRED EMBODIMENTS

A semiconductor wafer composed of silicon placed on a support ring sags on account of its own weight because support by the support ring is absent in the central region.

The inventors of the present invention have found that it is unfavorable to use a support ring having a horizontal surface for the placement of a semiconductor wafer, even if the inner edge between the horizontal placement surface and the inner lateral surface is rounded. The sagging of the semiconductor wafer leads, in particular in the region of the inner edge of the support ring, to a stress field that regularly brings about slip. The thermal treatment of the semiconductor wafer also simultaneously effects partial smoothing of unevenness generated by slip. Therefore, such slip often cannot be detected. However, it leads to a deterioration of the nanotopography of the semiconductor wafer, and defocusing problems during exposure of the front side of the semiconductor wafer during fabrication of electronic components may occur. The nanotopography describes flatness deviations in a measurement range with a spatial wavelength of 0.2 to 20 mm. An expedient measurement method for determining the nanotopography is optical interferometry. Measuring devices based thereon are commercially available. In the context of the invention, the nanotopography of the front side of the semiconductor wafer is measured in order to characterize the flatness of the front side and in order to be able to estimate the effect of the thermal treatment on the flatness. The front side of the semiconductor wafer is the side provided for the integration of electronic structures.

Figure 1:
FIG. 1 is a sectional illustration of a prior art support ring.

FIG. 1 shows, in a sectional illustration, a support ring of the prior art. This support ring is characterized by a horizontal surface 1 for the placement of a semiconductor wafer.

Figure 2:
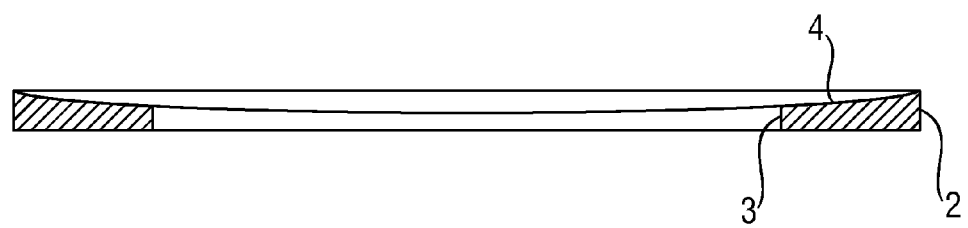
FIG. 2 is a sectional illustration of one embodiment of a support ring in accordance with the present invention.

FIG. 2 shows a support ring embodied according to the invention. This support ring is a closed ring and is distinguished by a curved surface 4 for the placement of the semiconductor wafer. The curved placement surface extends from the outer lateral surface 2 to the inner lateral surface 3 and therefore does not have a horizontally situated portion. The radius of curvature of the placement surface 4 is not less than 6000 mm and not more than 9000 mm, if the placement surface is designed for the placement of a semiconductor wafer having a diameter of 300 mm, or not less than 9000 mm and not more than 14,000 mm, if the placement surface is designed for the placement of a semiconductor wafer having a diameter of 450 mm, and preferably corresponds to the radius of the sagging of the semiconductor wafer. As a result, the stress field which acts on the semiconductor wafer during thermal treatment in the region of the inner edge between the placement surface and the inner lateral surface of the support ring is significantly lower than with the use of a support ring having a completely or partly horizontal placement surface. The use of a support ring embodied according to the invention affords the advantage of a lower density of defects generated by stresses, which is also manifested in an improved nanotopography of the front side of the thermally treated semiconductor wafer.

The external diameter of the support ring is preferably equal to the diameter of the semiconductor wafer placed on the curved surface for the purpose of the thermal treatment, or greater by up to not more than 2 mm. The internal diameter of the support ring is preferably not less than 60 mm and not more than 100 mm smaller than the external diameter. The support ring preferably consists of silicon carbide or is coated with silicon carbide.

It is furthermore advantageous if the curved surface for the placement of the semiconductor wafer satisfies specific roughness and flatness criteria. The average roughness depth Rz should preferably not be less than 3 μm and not more than 5 μm and the maximum individual roughness depth Rmax should preferably be not more than 5 μm. The average roughness depth Rz corresponds to the arithmetic mean of the individual roughness depths (the difference between highest peak and deepest valley relative to an individual measurement section). The individual roughness depths are determined with the aid of a roughness-mapping profile over a total measurement section subdivided into five individual measurement sections. A roughness characterized by an average roughness depth Rz of less than 3 μm is less favorable because it promotes the slipping of the semiconductor wafer on the support ring. A roughness characterized by an average roughness depth Rz of over 5 μm entails the risk of local material points adversely affecting the nanotopography of the thermally treated semiconductor wafers.

Furthermore, the material proportion Rmr(t) of the curved placement surface at a cutting depth t of 2 μm should not be less than 85%. The characteristic value is defined in DIN EN ISO 4287 and denotes the percentage proportion (bearing proportion) made up by the material-comprising sections in the total measurement section at the specified cutting depth. The latter is calculated from the highest peak of the profile. An Rmr (2 μm) of less than 85%, in particular of less than 50%, is not favorable because the small material proportion is an indicator of the presence of local material points and correspondingly disadvantageously affects the nanotopography of the thermally treated semiconductor wafers. In the case of an Rmr (2 μm) of not less than 85%, material peaks are wider and rounded rather than tapering to a point.

Ultimately, the support ring should be shaped as ideally as possible. In order that the nanotopography of the front side of thermally treated semiconductor wafers reliably remains in the range striven for, the placement surface should deviate by preferably not more than 30 μm from an ideally shaped surface, the angle of inclination of which lies in the stated range. The surface form in accordance with the DIN ISO 1101 standard should therefore preferably be not more than 0.03 mm. Accordingly, the placement surface has to lie between two enveloping surfaces, the spacing of which is determined by spheres having a diameter of 30 μm, wherein the midpoint of the spheres lies on the geometrically ideal surface.

Upon complying with the stated criteria, thermally treated semiconductor wafers composed of monocrystalline silicon have the comparatively best nanotopography of the front side.

A second aspect of the invention is directed to a method for the thermal treatment of a semiconductor wafer composed of monocrystalline silicon, comprising placing the semiconductor wafer on a support ring which has an outer and an inner lateral surface and a curved surface extending from the outer to the inner lateral surface and serving for the placement of the semiconductor wafer, and heating a semiconductor wafer placed on the support ring to a temperature of not less than 1050° C. and not more than 1300° C. for a time period of not less than 30 min and not more than 180 min.

If the lower temperature limit is not reached or if the time period of the thermal treatment is shorter than 30 min, no "denuded zone" arises or a "denuded zone" arises which does not extend deeply enough into the interior of the semiconductor wafer. If the upper temperature limit is exceeded or if the time period of the thermal treatment is longer than 180 min, the method becomes uneconomical.

The method is also distinguished by the fact that criteria such as the upper yield stress of the semiconductor wafer material or the heating rate in the temperature range above 900° C. or the cooling rate in the temperature range up to 900° C. do not have to be taken particularly into account. Thus, even semiconductor wafers having a comparatively low concentration of nitrogen can be thermally treated without the formation of slip. It is nevertheless preferred to set the heating rate in the temperature range above 900° C. and the cooling rate in the temperature range up to 900° C. to values in the range of 1° C./min to 10° C./min.

The thermal treatment is preferably carried out in an atmosphere that does not react chemically with silicon under the prevailing conditions or in a reducing atmosphere. Examples include a thermal treatment in argon or in a mixture of argon and hydrogen.

A third aspect of the invention is an uncoated semiconductor wafer composed of monocrystalline silicon having a "denuded zone", having a nitrogen concentration of not less than $1 \times 10^{13}$ atoms/cm$^3$ and not more than $8 \times 10^{14}$ atoms/cm$^3$, and having a nanotopography of less than 20 nm relative to a circular measurement window having a diameter of 4 mm, and less than 40 nm relative to a circular measurement window having a diameter of 20 mm. The measurement of the nanotopography is effected in accordance with the SEMI standard M78.

If the nitrogen concentration is lower than the lower range limit, the semiconductor wafer stabilization due to the presence of nitrogen is too weak in its effect. If the nitrogen concentration exceeds the upper range limit, undesirable defects induced by nitrogen occur to an increased extent.

One method suitable for producing the semiconductor wafer is the method in accordance with the second aspect of the invention.

The "denuded zone" is a zone which extends from the front side of the semiconductor wafer, preferably not less than 8 μm into the interior of the semiconductor wafer, and in which no COP defects and BMD can be detected.

The semiconductor wafer preferably has an oxygen concentration of not less than $4 \times 10^{17}$ atoms/cm$^3$ and not more than $7.5 \times 10^{17}$ atoms/cm$^3$ (new ASTM) and a resistivity of 1 ohm·cm to 80 ohm·cm. The BMD density is preferably $5 \times 10^8$ to $2 \times 10^{10}$ cm$^{-3}$ outside the "denuded zone".

The diameter of the semiconductor wafer is preferably 300 mm or 450 mm.

The single crystal yielding the semiconductor wafer is pulled according to the Czochralski method from a melt contained in a crucible, at a pulling rate at which vacancies are formed in excess in relation to silicon interstitials. The single crystal is preferably cooled in the temperature range of 1150° C. to 1000° C. at a high cooling rate in order to limit the size of COP defects that form.

EXAMPLE

Semiconductor wafers composed of monocrystalline silicon having a diameter of 300 mm were subjected to a thermal treatment in a vertical furnace of the type A412 from the manufacturer ASM. The semiconductor wafers were heated in the course of the thermal treatment to a temperature of 1200° C. over a time period of 120 min.

The semiconductor wafers were sliced from single crystals which had been pulled, in the section of the single crystals from which the semiconductor wafers were derived, at an average pulling rate of 0.86 mm/min from a melt composed of silicon contained in a crucible and doped with nitrogen, according to the Czochralski method, and actively cooled. The cooling rate in the temperature range of 1150 to 1000° C. was 2.5 K/min in the center and 3.2 K/min at the edge of the respective single crystal.

During the thermal treatment, the semiconductor wafers were situated on support rings composed of silicon carbide which were embodied in the manner illustrated in FIG. 2. The external diameter of the support rings was 1 mm greater than the diameter of the semiconductor wafers.

The roughness profile of the bearing surface was measured by means of a profiler. The average roughness depth Rz, in the case of the support rings used, was in the range of 3 μm to 5 μm and the largest measured individual roughness depth Rmax was not more than 5 μm. Furthermore, the material proportion Rmr(t) of the curved placement surface at a cutting depth t of 2 μm was not less than 85% in any of the support rings.

The measurement of the nanotopography of the wafers was carried out in accordance with SEMI standard M78, with a "fixed quality area" (FQA) of 297 mm, the "key options" NT-CC, the "threshold area" x=0.25% and the "cut-off wavelength" $\lambda_c$=20 mm. The evaluation was effected in accordance with the "deviation metric".

After a time period of 1000 process passes, not a single failure owing to exceeding of the upper limit of the permissible nanotopography of the front side of the semiconductor wafer was observed.

Under otherwise identical conditions, semiconductor wafers placed on a support ring embodied in accordance with the illustration in FIG. 1 were also thermally treated. In the case of these semiconductor wafers, failures were observed in significant numbers both after SIRD measurement and after measurement of the nanotopography.

Figure 3:
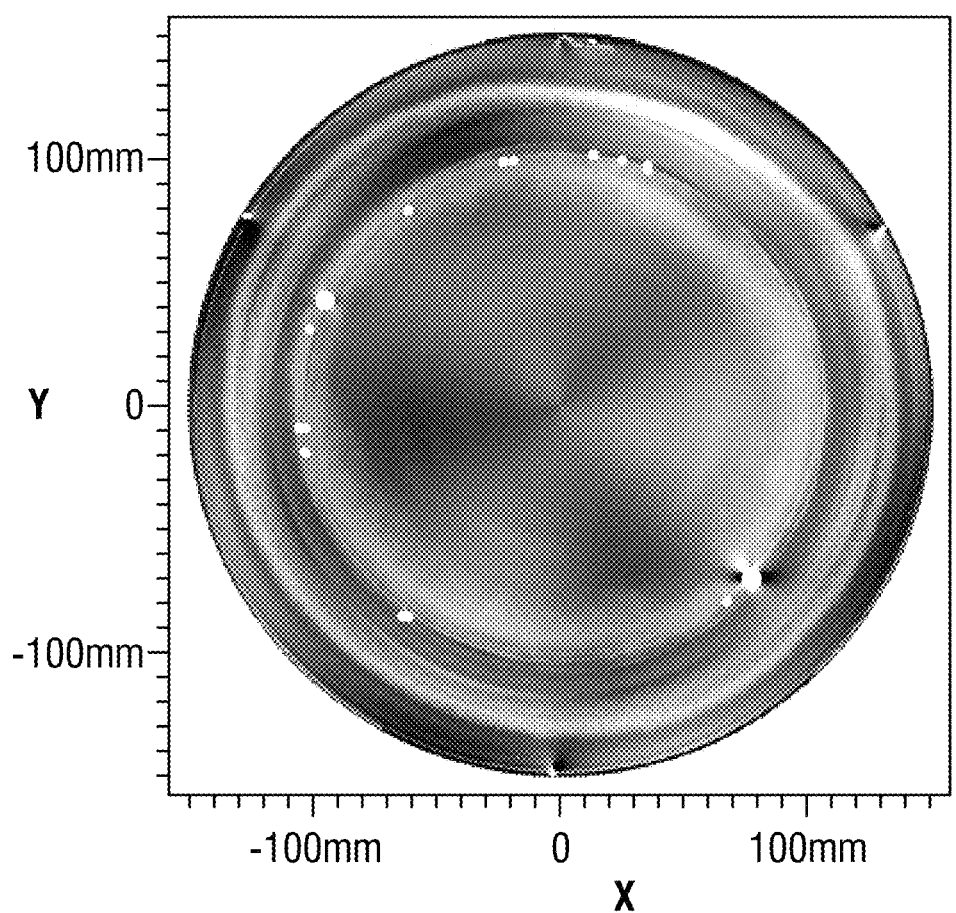
FIG. 3 is an SIRD image of a heat-treated, failed silicon wafer, treated by a prior art process.
Figure 4:
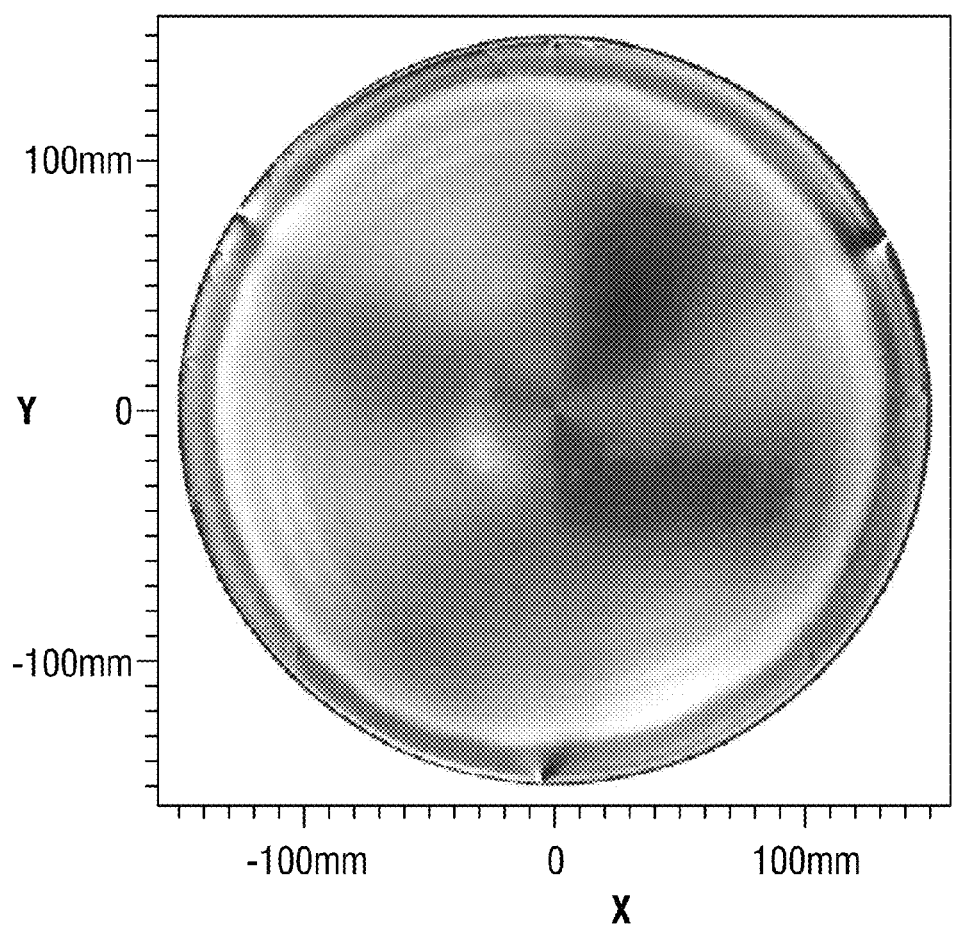
FIG. 4 is an SIRD image of a silicon wafer heat-treated in accordance with the invention.

FIGS. 3 and 4 show typical SIRD images of a failed semiconductor wafer and of a semiconductor wafer according to the invention. The recorded images were created using a measuring device of the type SIRD A300P from the manufacturer PVA TePla. Local SIRD stresses as a reason for the failure of the semiconductor wafer are marked in FIG. 3. The position of the markings shows that the stresses were brought about by the interaction of semiconductor wafer and inner edge of the support ring.

Figure 5:
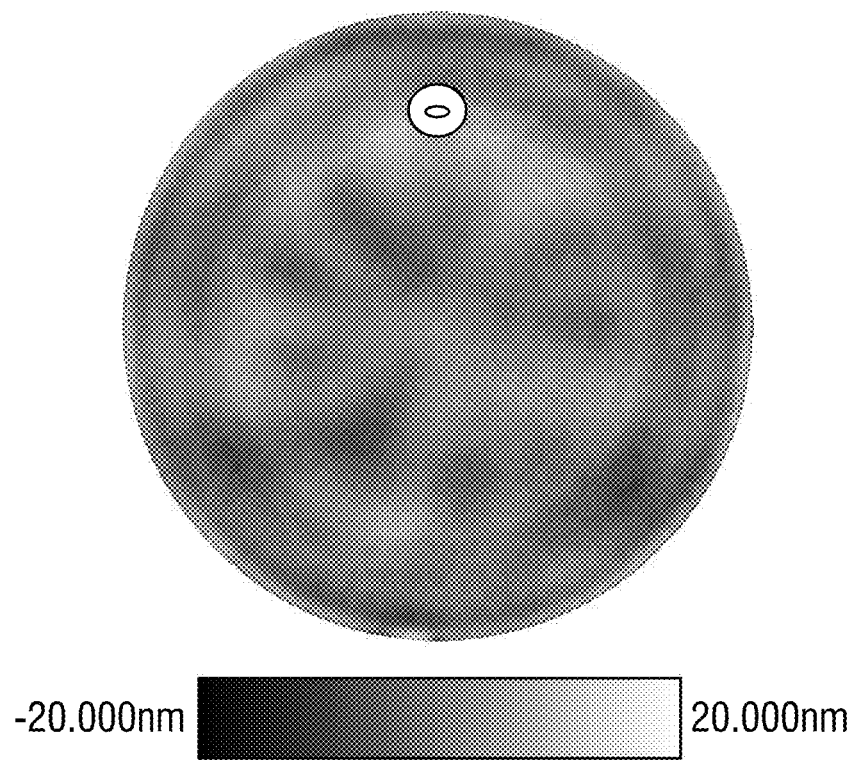
FIG. 5 is a nanotopography measurement image of a failed silicon wafer processed by a prior art process.
Figure 6:
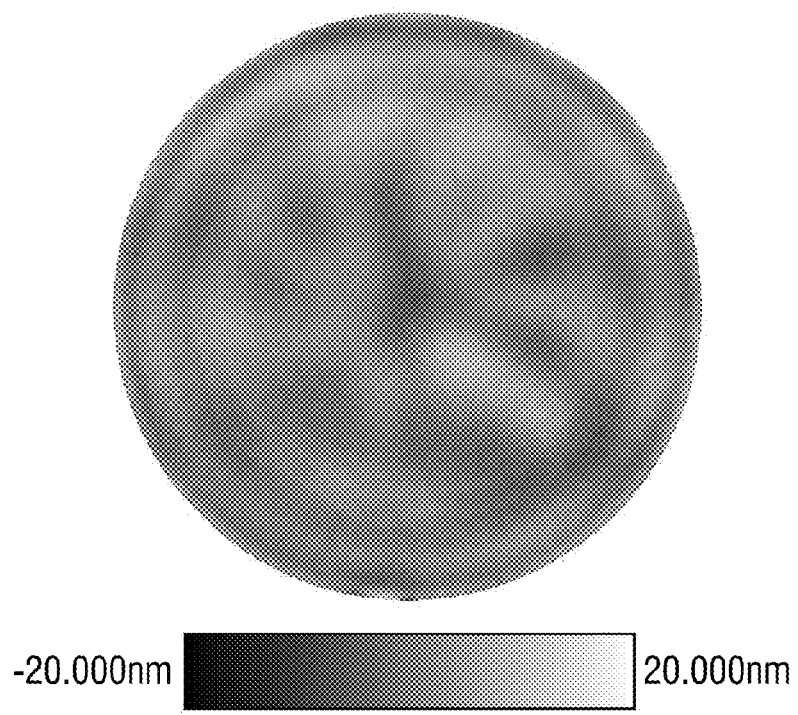
FIG. 6 is a nanotopography measurement image of a silicon wafer processed in accordance with the invention.

FIGS. 5 and 6 show typical nanotopography measurements of the front side of a failed semiconductor wafer and of a semiconductor wafer according to the invention. The recorded images were created using a measuring device of the type WaferSight2 from the manufacturer KLA Tencor. An exceeding of the local nanotopography as a reason for the failure of the semiconductor wafer is marked in FIG. 5. Its position in the region of the inner edge of the support ring used shows that the form of the support ring is responsible for exceeding the local nanotopography requirements.

The semiconductor wafer illustrated in FIG. 5 had a nanotopography of 8.68 nm, relative to a measurement window having a diameter of 4 nm, and of 55.56 nm, relative to a measurement window having a diameter of 20 mm. In the case of the semiconductor wafer according to the invention as illustrated in FIG. 6, the corresponding measured values were 4.48 nm, and 10.01 nm, respectively.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A support ring for supporting a semiconductor wafer comprising monocrystalline silicon during a thermal treatment of the semiconductor wafer, the support ring having an external diameter and an internal diameter, comprising
    a ring having an outer and an inner lateral surface and a curved surface extending from the outer to the inner lateral surface, the curved surface serving for placement of a semiconductor wafer, wherein the curved surface has a radius of curvature of not less than 6000 mm and not more than 9000 mm, if the curved surface is designed for placement of a semiconductor wafer having a diameter of 300 mm, or has a radius of curvature of not less than 9000 mm and not more than 14,000 mm, if the curved surface is designed for the placement of a semiconductor wafer having a diameter of 450 mm, and wherein the curved surface has a material proportion Rmr(t) of not less than 85% at a material depth t of 2 μm.

2. The support ring of claim 1, wherein the curved surface has an average roughness depth Rz of not less than 3 μm and not more than 5 μm and a maximum individual roughness depth Rmax of not more than 5 μm.

3. The support ring of claim 1, wherein the surface form tolerance of the curved surface is not more than 0.03 mm.

4. The support ring of claim 1, wherein the external diameter of the support ring is equal to the diameter of a semiconductor wafer to be treated or is greater by not more than 2 mm, and the internal diameter of the support ring is not less than 60 mm and not more than 100 mm smaller than the external diameter.

5. The support ring of claim 1, wherein the support ring is constructed from silicon carbide or is coated with silicon carbide.

6. A method for the thermal treatment of a semiconductor wafer of monocrystalline silicon, comprising placing the semiconductor wafer on a support ring having an external diameter and an internal diameter, comprising
    a ring having an outer and an inner lateral surface and a curved surface extending from the outer to the inner lateral surface, the curved surface serving for placement of a semiconductor wafer, wherein the curved surface has a radius of curvature of not less than 6000 mm and not more than 9000 mm, if the curved surface is designed for placement of a semiconductor wafer having a diameter of 300 mm, or has a radius of curvature of not less than 9000 mm and not more than 14,000 mm, if the curved surface is designed for the placement of a semiconductor wafer having a diameter of 450 mm, and wherein the curved surface has a material proportion Rmr(t) of not less than 85% at a material depth t of 2 μm and heating the semiconductor wafer positioned on the support ring to a temperature of not less than 1050° C. and not more than 1300° C. for a time period of not less than 30 min and not more than 180 min.

7. An uncoated semiconductor wafer having a front side and a back side, composed of monocrystalline silicon having a denuded zone on at least one surface thereof, formed by a heat treatment, the silicon wafer having a nitrogen concentration of not less than $1 \times 10^{13}$ atoms/cm$^3$ and not more than $8 \times 10^{14}$ atoms/cm$^3$ and having a nanotopography of the front side of the semiconductor wafer of less than 20 nm relative to a circular measurement window having a diameter of 4 mm, and less than 40 nm relative to a circular measurement window having a diameter of 20 mm.

* * * * *